(12) United States Patent
Yamada

(10) Patent No.: US 7,785,755 B2
(45) Date of Patent: Aug. 31, 2010

(54) EXPOSURE SYSTEM, EXPOSURE METHOD, AND METHOD FOR MANUFACTURING SEMICONDUCTOR DEVICE

(75) Inventor: Noriteru Yamada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 873 days.

(21) Appl. No.: 11/652,513

(22) Filed: Jan. 12, 2007

(65) Prior Publication Data

US 2007/0166633 A1     Jul. 19, 2007

(30) Foreign Application Priority Data

Jan. 13, 2006   (JP)   .............................. P2006-006037

(51) Int. Cl.
*G03F 9/00* (2006.01)
(52) U.S. Cl. ........................... 430/30; 382/144; 382/145
(58) Field of Classification Search .................... 430/30; 382/144, 145
See application file for complete search history.

(56) References Cited

FOREIGN PATENT DOCUMENTS

JP        2001-244172           9/2001

*Primary Examiner*—Christopher G Young
(74) *Attorney, Agent, or Firm*—Finnegan, Henderson, Farabow, Garrett & Dunner, L.L.P.

(57) ABSTRACT

An exposure system includes a exposure tool for projecting an image of a mask pattern onto a first resist with test values of a dose to form test resist patterns, a microscope for defining coordinates of mask positions along the mask pattern in a scan direction, measuring actual values of a mask line width of the mask pattern at the coordinates, and measuring actual values of a resist line width of each of the test resist patterns at projected positions, a collection module for collecting a relationship among the mask line width, the resist line width, and the dose at the coordinates, and a tool controller for controlling the exposure tool to project the image of the mask pattern onto a second resist with changing the dose depending on the coordinates to make the resist line width constant, based on the relationship.

12 Claims, 9 Drawing Sheets

EXPOSURE SYSTEM, EXPOSURE METHOD, AND METHOD FOR MANUFACTURING SEMICONDUCTOR DEVICE

CROSS REFERENCE TO RELATED APPLICATIONS AND INCORPORATION BY REFERENCE

This application is based upon and claims the benefit of priority from prior Japanese Patent Application P2006-006037 filed on Jan. 13, 2006; the entire contents of which are incorporated by reference herein.

BACKGROUND OF THE INVENTION

1. Field of the Invention

The present invention relates to photolithographic projection and in particular to an exposure system, an exposure method, and a method for manufacturing a semiconductor device.

2. Description of the Related Art

As the method for projecting an image of a mask pattern on a photomask onto a resist layer, a single shot exposure method and a scanning exposure method are used. By the single shot exposure method, all portion of the mask pattern is irradiated by light to form a latent image of a resist pattern on the resist layer in one shot. On the contrary, by the scanning exposure method, the photomask and a semiconductor substrate coated with the resist layer are scanned simultaneously during the image of the mask pattern is projected onto the resist layer to form the latent image of the resist pattern.

The scanning exposure method provides a constant contrast. Recently, the scanning exposure method has been widely introduced to the process for manufacturing the semiconductor device to keep pace with shrinking chip dimensions. Japanese Patent Laid-Open Publication No. 2001-244172 discloses a method to correct a dimensional error of the resist pattern caused by the scanning exposure method. However, there is no method for forming the resist pattern having the constant line width in the case where the mask pattern has a manufacturing error.

SUMMARY OF THE INVENTION

An aspect of present invention inheres in an exposure system according to an embodiment of the present invention. The exposure system includes a scanning exposure tool configured to scan and project an image of a mask pattern onto a first resist layer with a plurality of test values of a dose to form a plurality of test resist patterns. The exposure system further includes a microscope configured to define a plurality of coordinates of mask positions along the mask pattern in a scan direction, measure a plurality of actual values of a mask line width of the mask pattern at the plurality of coordinates, and measure a plurality of actual values of a resist line width of each of the plurality of test resist patterns at a plurality of projected positions. The plurality of projected positions correspond to the plurality of mask positions, in the scan direction. The exposure system further includes a collection module configured to collect a relationship among the mask line width, the resist line width, and the dose at the plurality of coordinates of mask positions, and an exposure tool controller configured to control the scanning exposure tool to scan and project the image of the mask pattern onto a second resist layer with changing the dose depending on the plurality of coordinates of mask positions, based on the relationship, in order to make the resist line width constant in the scan direction.

Another aspect of the present invention inheres in an exposure method according to the embodiment of the present invention. The exposure method includes forming a plurality of test resist patterns by scanning and projecting an image of a mask pattern onto a first resist layer with a plurality of test values of a dose. The exposure method further includes defining a plurality of coordinates of mask positions along the mask pattern in a scan direction, measuring a plurality of actual values of a mask line width of the mask pattern at the plurality of coordinates, and measuring a plurality of actual values of a resist line width of each of the plurality of test resist patterns at a plurality of projected positions. The plurality of projected positions correspond to the plurality of mask positions, in the scan direction. The exposure method further includes collecting a relationship among the mask line width, the resist line width, and the dose at the plurality of coordinates of the mask positions, and scanning and projecting the image of the mask pattern onto a second resist layer with changing the dose depending on the plurality of coordinates of the mask positions, based on the relationship, in order to make the resist line width constant, in the scan direction.

Yet another aspect of the present invention inheres in a method for manufacturing a semiconductor device according to the embodiment of the present invention. The method for manufacturing the semiconductor device includes forming a first resist layer on a first semiconductor substrate, and forming a plurality of test resist patterns on the first semiconductor substrate by scanning and projecting an image of a mask pattern onto the first resist layer with a plurality of test values of a dose. The method for manufacturing the semiconductor device further includes defining a plurality of coordinates of mask positions along the mask pattern in a scan direction, measuring a plurality of actual values of a mask line width of the mask pattern at the plurality of coordinates, and measuring a plurality of actual values of a resist line width of each of the plurality of test resist patterns at a plurality of projected positions. The plurality of projected positions correspond to the plurality of mask positions in the scan direction. The method for manufacturing the semiconductor device further includes collecting a relationship among the mask line width, the resist line width, and the dose at the plurality of coordinates of the mask positions, and forming a second resist layer on a second semiconductor substrate. The method for manufacturing the semiconductor device further includes scanning and projecting the image of the mask pattern onto the second resist layer with changing the dose depending on the plurality of coordinates of the mask positions, based on the relationship, in order to make the resist line width constant in the scan direction, and forming a product resist pattern corresponding to the image of the mask pattern on the second semiconductor substrate.

DETAILED DESCRIPTION OF THE INVENTION

Figure 1:
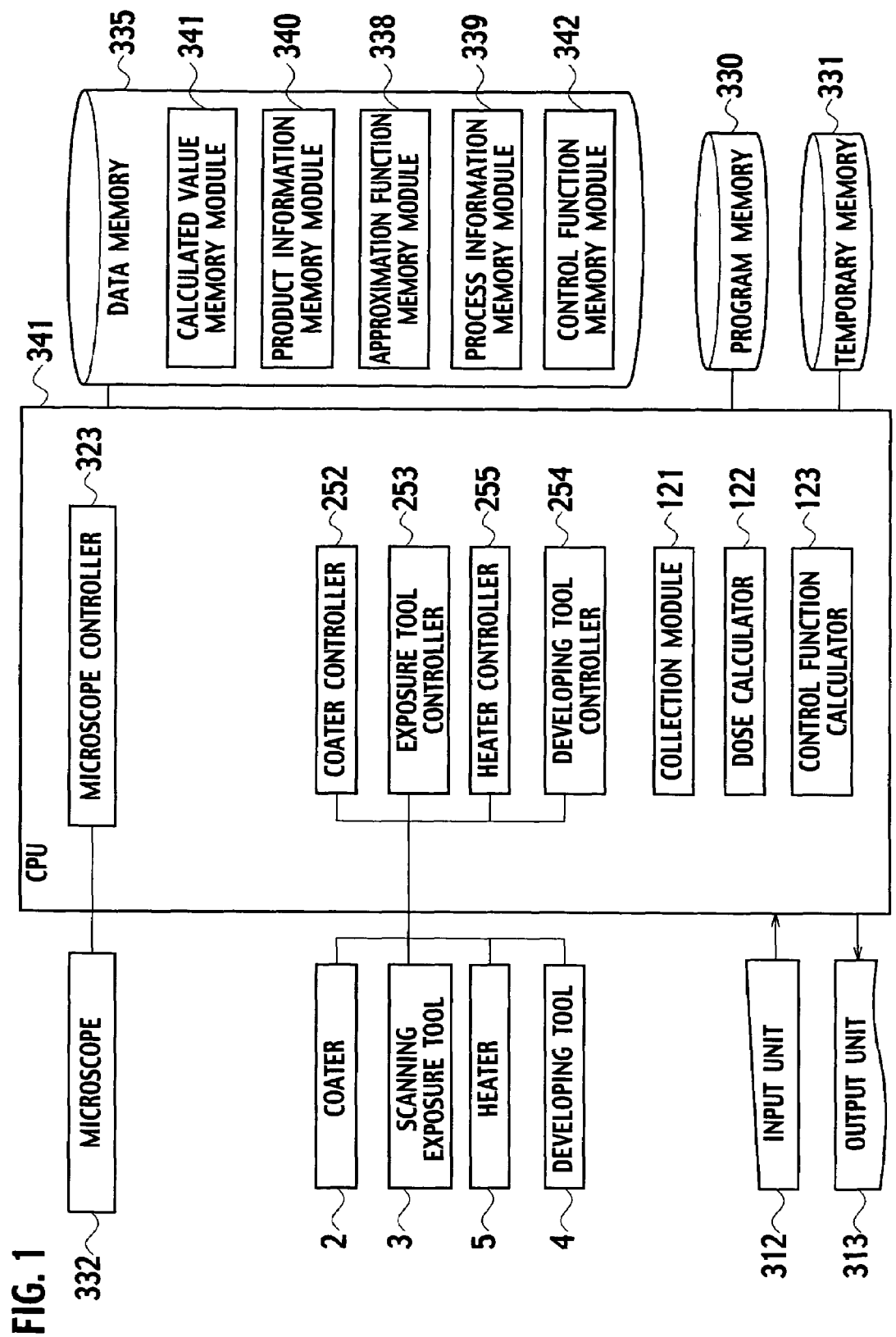
FIG. 1 is a diagram of an exposure system in accordance with an embodiment of the present invention.

An embodiment of the present invention will be described with reference to the accompanying drawings. It is to be noted that the same or similar reference numerals are applied to the same or similar parts and elements throughout the drawings, and the description of the same or similar parts and elements will be omitted or simplified.

With reference to FIG. 1, an exposure system, in accordance with the embodiment, includes a scanning exposure tool 3 and a microscope 332. The scanning exposure tool 3 is configured to form a plurality of test resist patterns by scanning and projecting an image of a mask pattern onto a first resist layer with a plurality of test values of a dose. The microscope 332 is configured to define a plurality of coordinates of mask positions along the mask pattern in a scan direction and measure a plurality of actual values of a mask line width of the mask pattern at the coordinates of the mask positions. Here, the "mask line width" means a line width of the mask pattern. The microscope is also configured to measure a plurality of actual values of a resist line width of each of the test resist patterns at a plurality of projected positions. Here, the "resist line width" means a line width of the resist pattern. The projected positions correspond to the mask positions, in the scan direction. The exposure system further includes a central processing unit (CPU) 300. The CPU 300 includes a collection module 121 and an exposure tool controller 253. The collection module 121 is configured to collect a relationship among the mask line width, the resist line width, and the dose at each of the coordinates of the mask positions. The exposure tool controller 253 is configured to instruct the scanning exposure tool 3 to scan and project the image of the mask pattern onto a second resist layer with changing the dose depending on the mask positions, based on the relationship, to make the resist line width constant in the scan direction.

Figure 2:
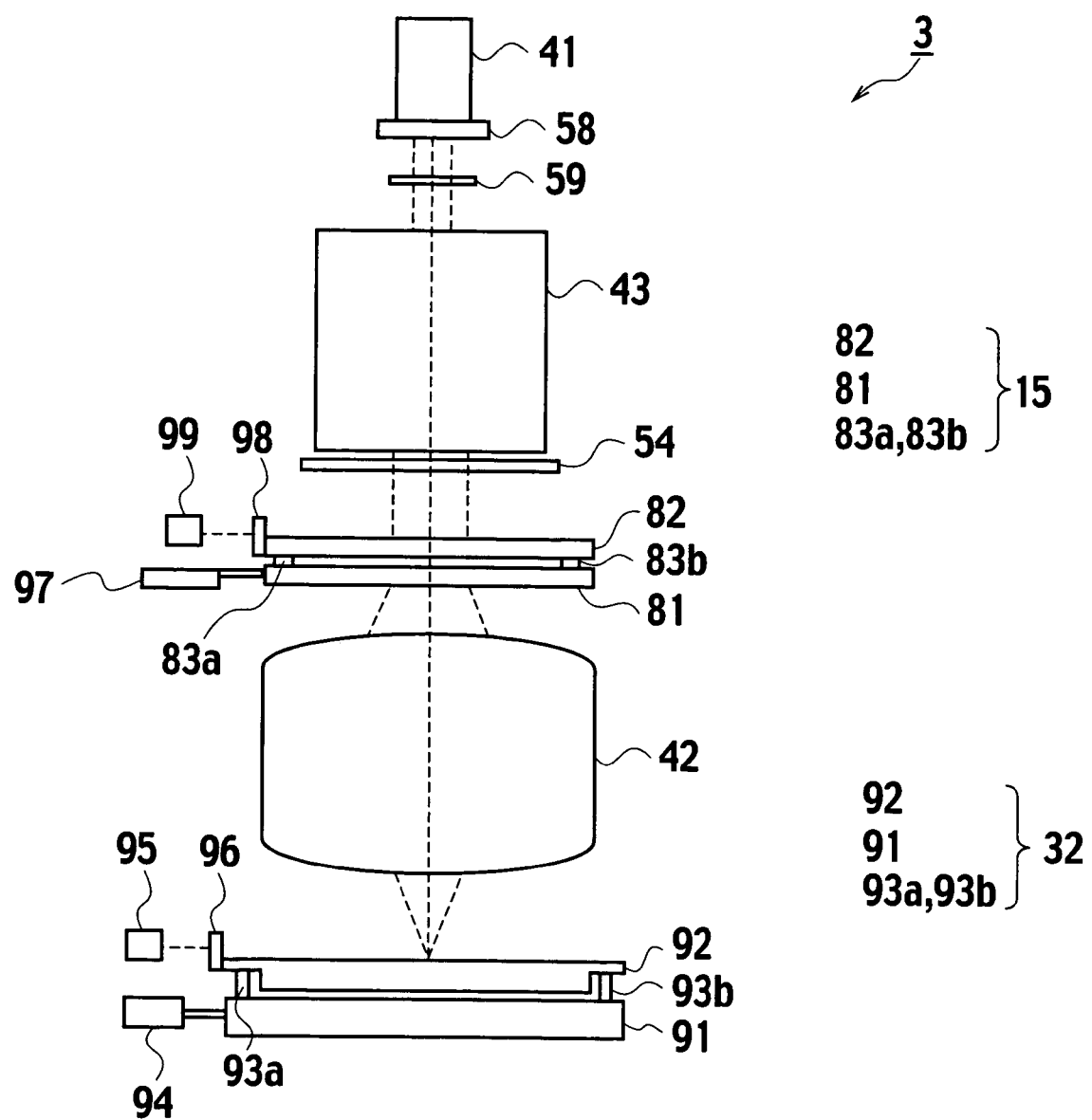
FIG. 2 illustrates an exposure tool in accordance with the embodiment of the present invention.

With reference to FIG. 2, the scanning exposure tool 3 includes a light source 41 for emitting light, an aperture diaphragm holder 58 disposed under the light source 41, a polarizer 59 for polarizing the light emitted from the light source 41, an illuminator 43 for condensing the light, and a slit holder 54 disposed under the illuminator 43. The scanning exposure tool 3 further includes a reticle stage 15 disposed beneath the slit holder 54, a projection optical system 42 disposed beneath the reticle stage 15, and a wafer stage 32 disposed beneath the projection optical system 42.

The reticle stage 15 includes a reticle XY stage 81, shafts 83a, 83b provided on the reticle XY stage 81, and a reticle tilting stage 82 attached to the reticle XY stage 81 through the shafts 83a, 83b. The reticle stage 15 is attached to a reticle stage aligner 97. The reticle stage aligner 97 aligns the position of the reticle XY stage 81. Each of the shafts 83a, 83b extends from the reticle XY stage 81. Therefore, the position of the reticle tilting stage 82 is determined by the reticle XY stage 81. The tilt angle of the reticle tilting stage 82 is determined by the shafts 83a, 83b. Further, a reticle stage mirror 98 is attached to the edge of the reticle tilting stage 82. The position of the reticle tilting stage 82 is monitored by an interferometer 99 disposed opposite the reticle stage mirror 98.

The wafer stage 32 includes a wafer XY stage 91, shafts 93a, 93b provided on the wafer XY stage 91, and a wafer tilting stage 92 attached to the wafer XY stage 91 through the shafts 93a, 93b. The wafer stage 32 is attached to a wafer stage aligner 94. The wafer stage aligner 94 aligns the position of the wafer XY stage 91. Each of the shafts 93a, 93b extends from the wafer XY stage 91. Therefore, the position of the wafer tilting stage 92 is determined by the wafer XY stage 91. The tilt angle of the wafer tilting stage 92 is determined by the shafts 93a, 93b. Further, a wafer stage mirror 96 is attached to the edge of the wafer tilting stage 92. The position of the wafer tilting stage 92 is monitored by an interferometer 95 disposed opposite the wafer stage mirror 96.

Figure 3:
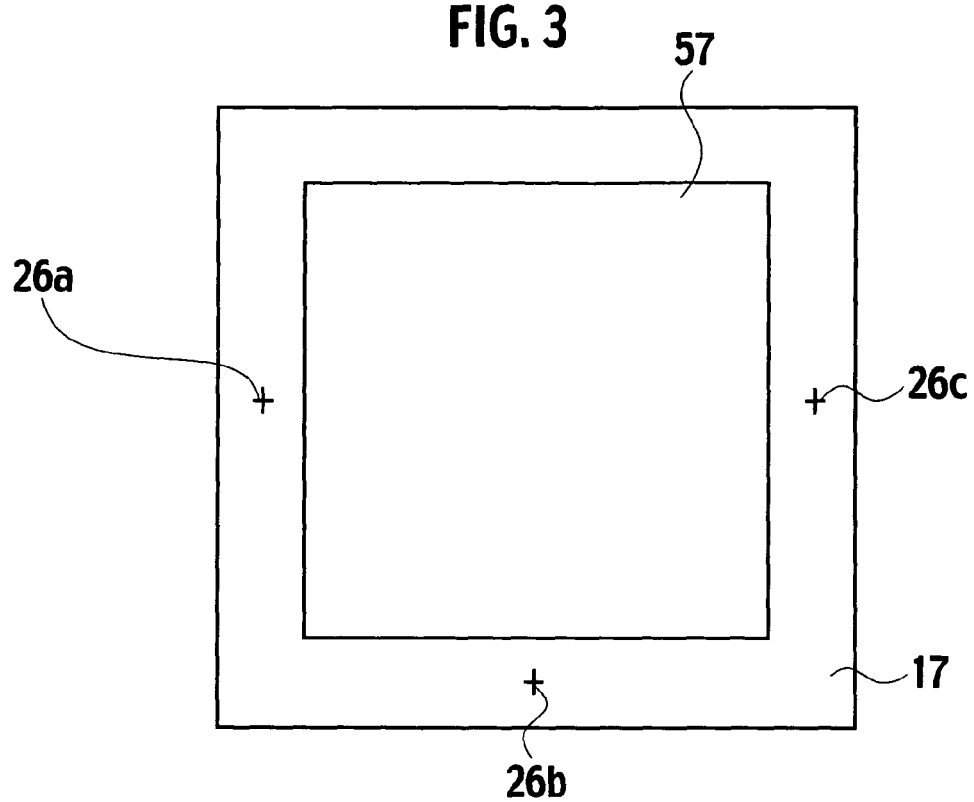
FIG. 3 is a plan view of a photomask in accordance with the embodiment of the present invention.
Figure 4:
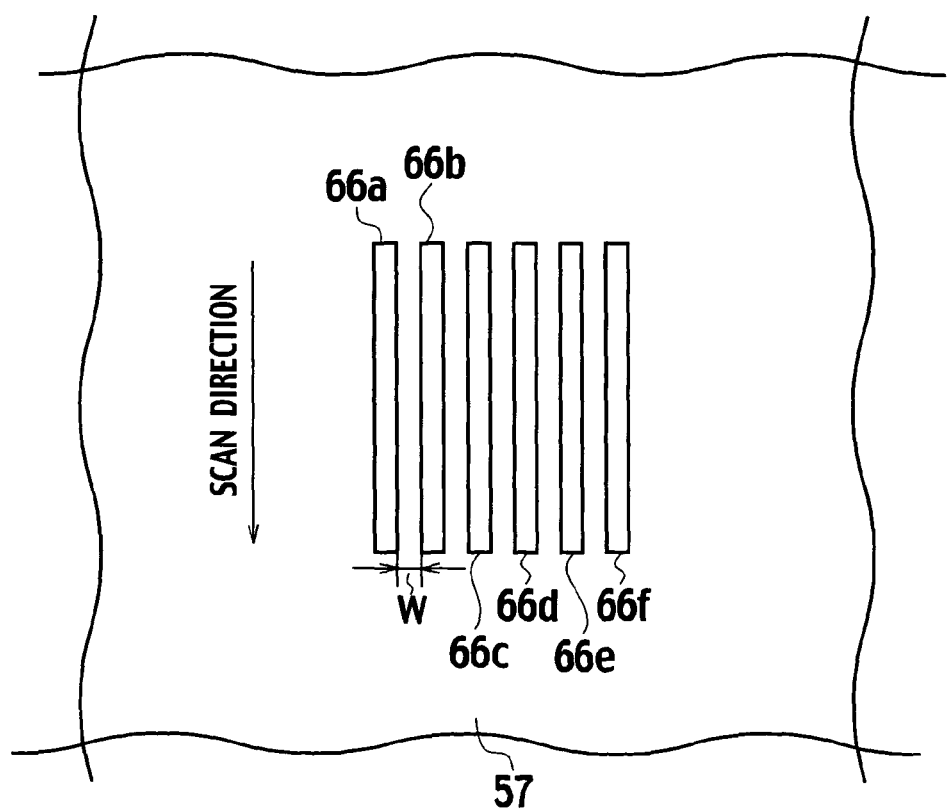
FIG. 4 is a first enlarged plan view of the photomask in accordance with the embodiment of the present invention.
Figure 5:
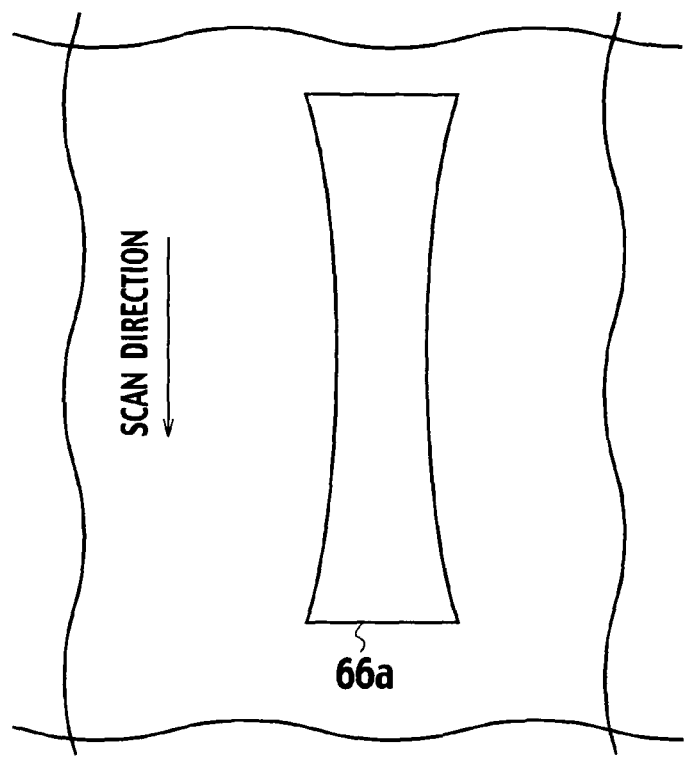
FIG. 5 is a second enlarged plan view of the photomask in accordance with the embodiment of the present invention.

A photomask, shown in FIG. 3, is disposed on the reticle stage 15. The photomask includes a device pattern window 57 surrounded by a light shielding film 17. With reference to FIG. 4, the plurality of striped mask patterns 66a, 66b, 66c, 66d, 66e, 66f are delineated in the device pattern window 57. The photomask is disposed on the reticle stage 15 so that each lengthwise direction of the mask patterns 66a-66f is parallel to the scan direction of the scanning exposure tool 3. Each shape of the mask patterns 66a-66f may correspond to a rectangular wiring pattern of a semiconductor device, for example. Alternatively, each shape of the mask patterns 66a-66f may correspond to a contact between wiring layers of the semiconductor device. The light emitted from the light source 41, shown in FIG. 2, passes through the mask patterns 66a-66f and reaches the first resist layer coated on a first semiconductor substrate disposed on the wafer stage 32. The first semiconductor substrate is composed of silicon (Si), for example. The designed shape of the mask pattern 66a is rectangular. However, the mask pattern 66a may be constricted near the center portion, as shown in FIG. 5, because of the manufacturing error of the photomask. Other mask patterns 66b-66f may also be constricted. The alignment marks 26a, 26b, 26c, shown in FIG. 3, are used for the arrangement of the photomask on the reticle stage 15 in the scanning exposure tool 3, shown in FIG. 2. Hereinafter, the case where the mask pattern 66a is used is described.

Figure 6:
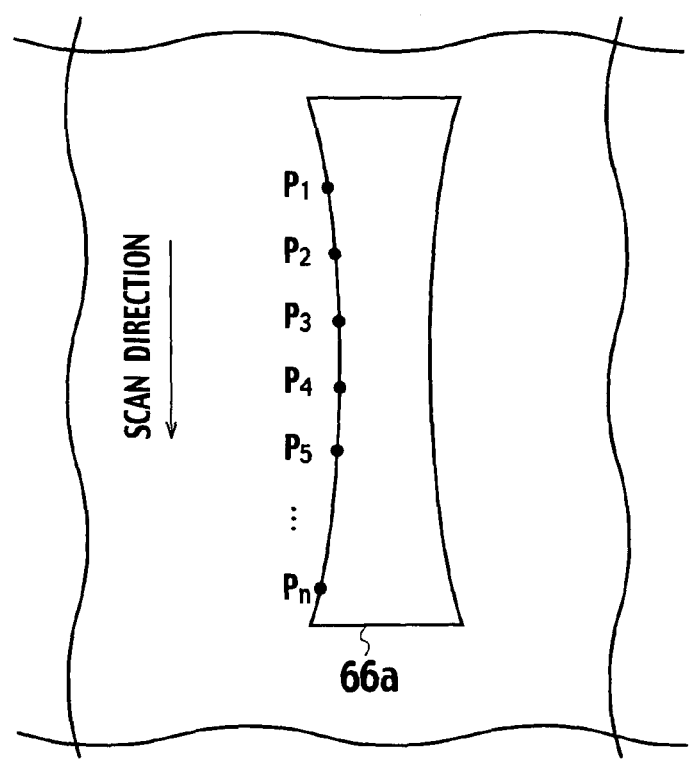
FIG. 6 is a third enlarged plan view of the photomask in accordance with the embodiment of the present invention.
Figure 7:
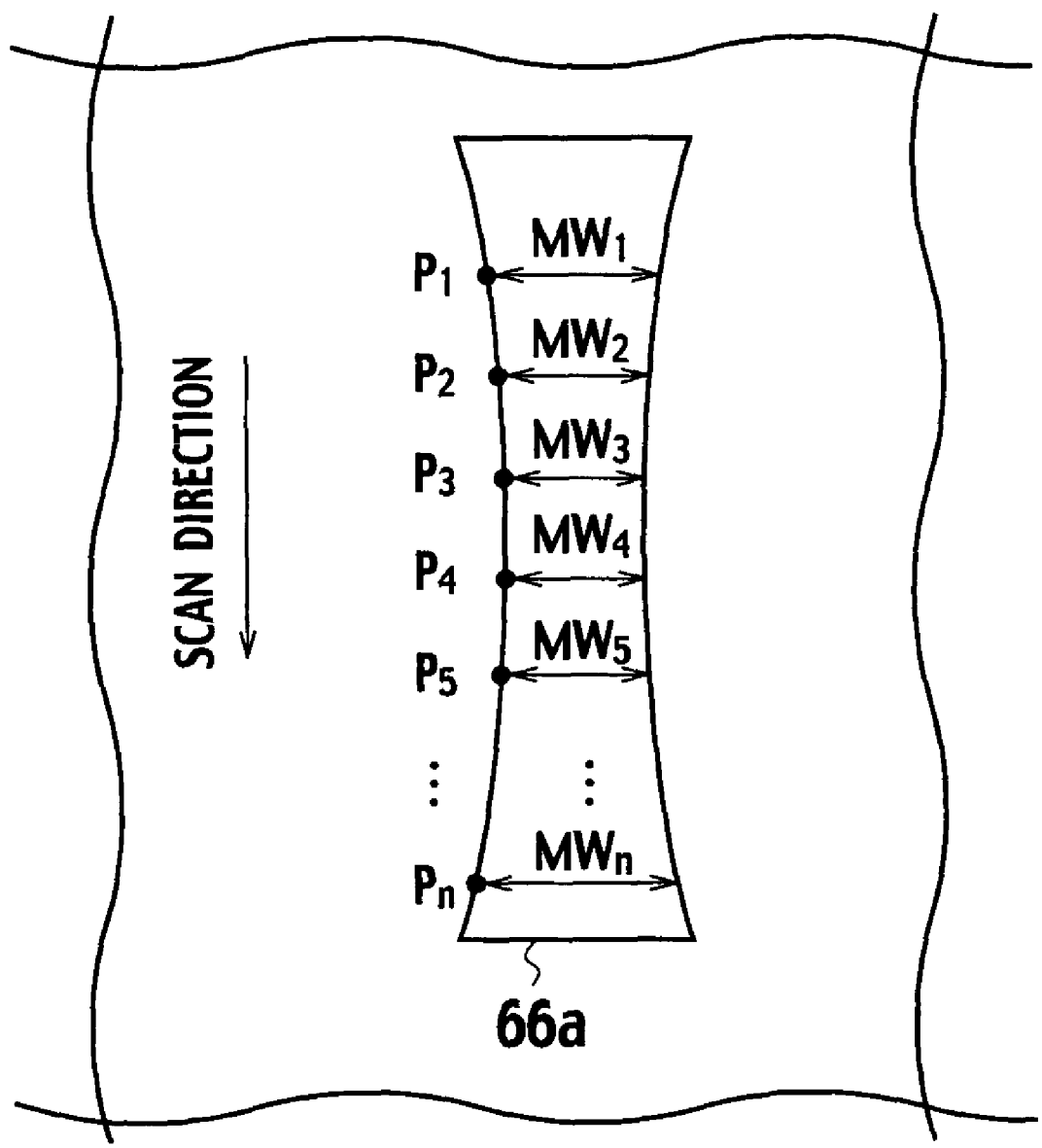
FIG. 7 is a fourth enlarged plan view of the photomask in accordance with the embodiment of the present invention.

With reference to FIG. 6, the microscope 332 defines a first coordinate "$P_1$" of the mask position, a second coordinate "$P_2$" of the mask position, a third coordinate "$P_3$" of the mask position, a fourth coordinate "$P_4$" of the mask position, a fifth coordinate "$P_5$" of the mask position, -, an "n"-th coordinate "$P_n$" of the mask position along the edge of the mask pattern 66a on the photomask. The microscope 332 defines the first to "n"-th coordinates in the scan direction. Here, "n" is a natural number. With reference to FIG. 7, the microscope 332 measures the actual value "$MW_1$" of the mask line width of the mask pattern 66a at the first coordinate "$P_1$", the actual value "$MW_2$" of the mask line width of the mask pattern 66a at the second coordinate "$P_2$", the actual value "$MW_3$" of the mask line width of the mask pattern 66a at the third coordinate "$P_3$", the actual value "$MW_4$" of the mask line width of the mask pattern 66a at the fourth coordinate "$P_4$", the actual value "$MW_5$" of the mask line width of the mask pattern 66a at the fifth coordinate "$P_5$", and the actual value "$MW_n$" of the mask line width of the mask pattern 66a at the "n"-th coordinate "$P_n$". The atomic force microscope (AFM) and the scanning electron microscope (SEM) can be used for the microscope 332, for example.

Figure 8:
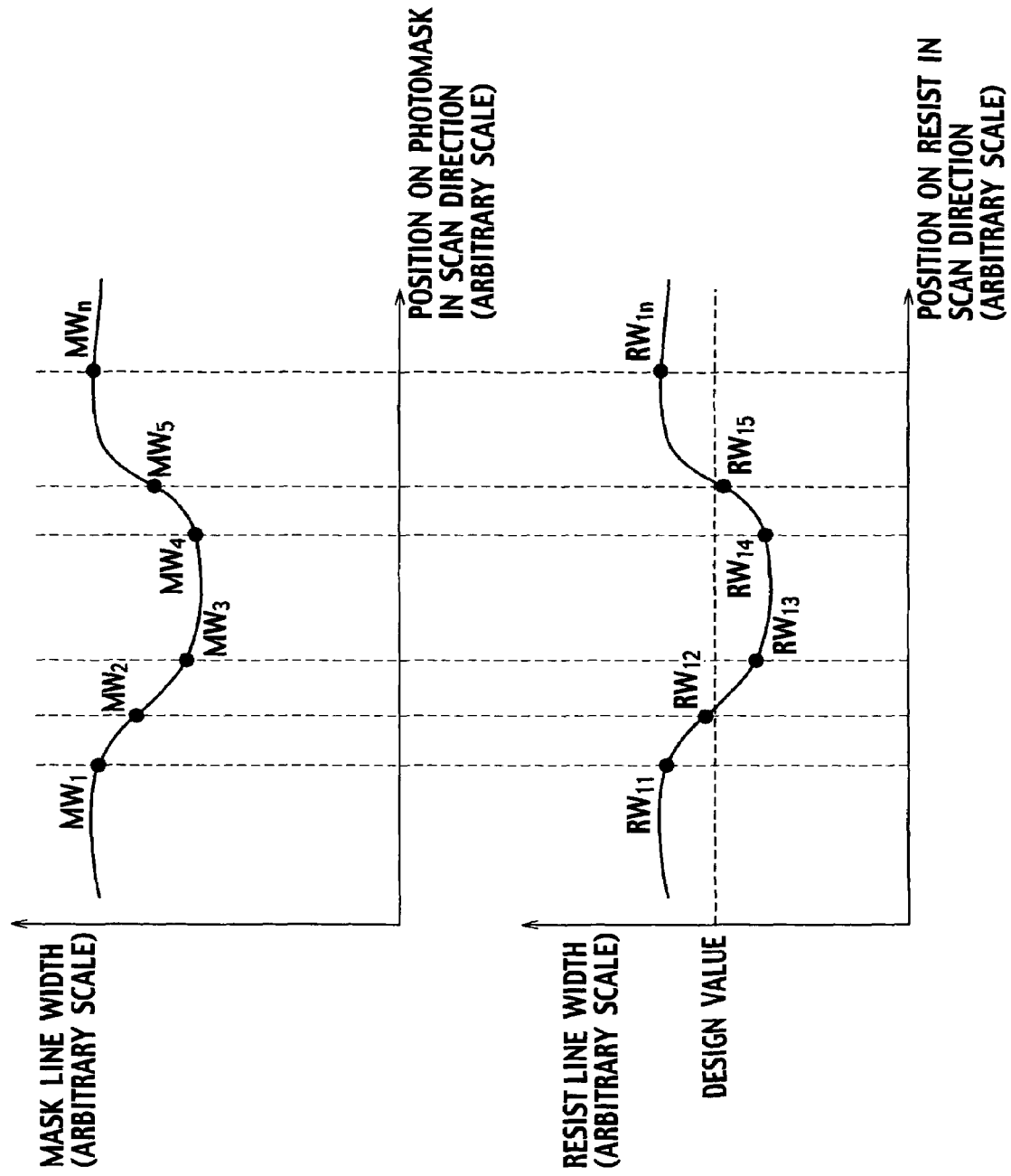
FIG. 8 is a graph showing a relationship between a mask line width and a resist line width in accordance with the embodiment of the present invention.

Also, the microscope 332 measures "i"-th actual values "$RW_{i1}$", "$RW_{i2}$", "$RW_{i3}$", "$RW_{i4}$", "$RW_{i5}$", -, "$RW_{in}$" of the resist line width of the test resist pattern. Here, "i" is a natural number. The test resist pattern is formed by scanning and projecting the image of the mask pattern 66a onto the first resist layer by the scanning exposure tool 3 with the dose of the "i"-th test value. The "i"-th actual values "$RW_{i1}$", "$RW_{i2}$", "$RW_{i3}$", "$RW_{i4}$", "$RW_{i5}$", -, "$RW_{in}$" of the resist line width are measured at projected positions corresponding to the first to "n"-th coordinates "$P_1$"-"$P_n$", respectively. When the mask pattern 66a designed as rectangular is constricted, as shown in FIG. 7, the actual value "$MW_n$" of the mask line width in the scan direction is decreased and increased again, as shown in FIG. 8 plotting the actual values "$MW_1$"-"$MW_n$" of the mask line width. Therefore, the first actual value "$RW_{1n}$" of the resist line width of the test resist pattern formed by scanning and projecting the image of the mask pattern 66a with the dose of the first test value is also decreased and increased again, in the scan direction. Accordingly, the first actual value "$RW_{1n}$" has an error in comparison with the design value "$RW_D$" of the resist line width of the test resist pattern designed as rectangular. Similar phenomenon can be seen for the second to "i"-th actual values "$RW_{2n}$" to "$RW_{in}$".

Figure 9:
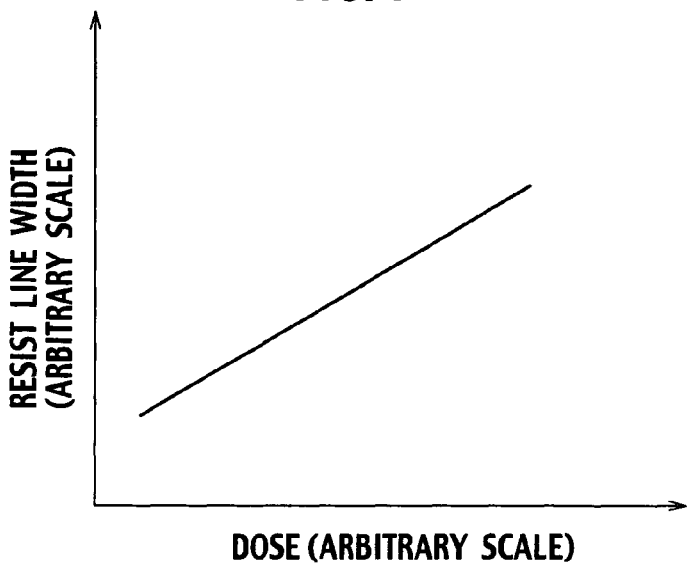
FIG. 9 is a graph showing a relationship between the resist line width and a dose in accordance with the embodiment of the present invention.
Figure 10:
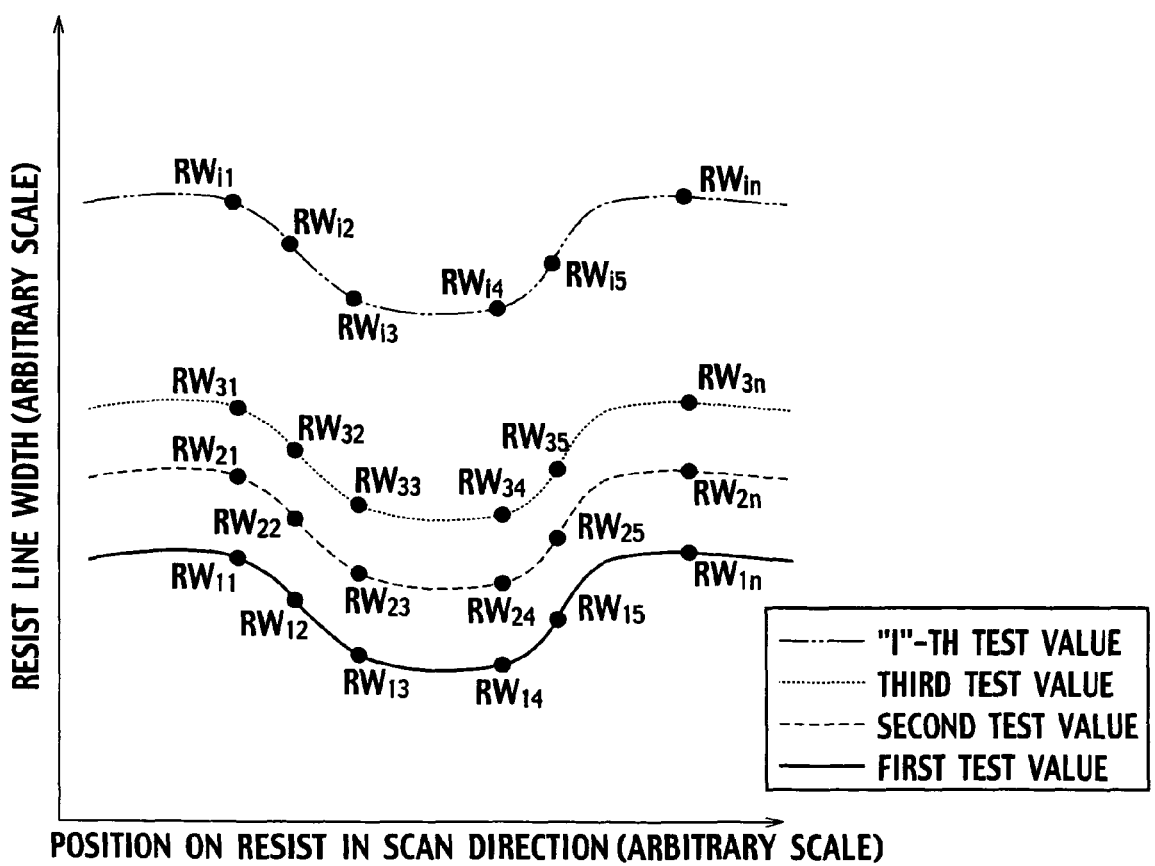
FIG. 10 is a graph showing the resist line width under a plurality of test values of the dose in accordance with the embodiment of the present invention.

When the first resist layer is composed of the negative photoresist, the resist line width is increased as the dose is increased, as shown in FIG. 9. Therefore, as shown in FIG. 10, the second actual value "$RW_{2n}$" of the resist line width of the test resist pattern formed with the dose of the second test value that is larger than the first test value is thicker than the first actual value "$RW_{1n}$" of the resist line width of the resist pattern formed with the dose of the first test value in all projected positions. Similarly, the third actual value "$RW_3$" of the resist line width of the test resist pattern formed with the dose of the third test value larger than the second test value is thicker than the second actual value "$RW_{2n}$" of the resist line width of the test resist pattern formed with the dose of the second test value, in all projected positions. Similarly, the "i"-th actual value "$RW_{in}$" of the resist line width of the test resist pattern formed with the dose of the "i"-th test value larger than the "(i−1)"-th test value is thicker than the "(i−1)"-th actual value "$RW_{(i-1)n}$" of the resist line width of the test resist pattern formed with the dose of the "(i−1)"-th test value. It should be noted that the average of the measured actual values can be used for each of the "i"-th actual values "$RW_{i1}$", "$RW_{i2}$", "$RW_{i3}$", "$RW_{i4}$", "$RW_{i5}$", -, "$RW_{in}$" of the resist line width. By using the average value, the measurement accuracy is improved.

With reference again to FIG. 1, the collection module 121 collects a first relationship between the first to "i"-th test values of the dose and the first to "i"-th actual values "$RW_{11}$", "$RW_{21}$", "$RW_{31}$", "$RW_{41}$", "$RW_{51}$", -, "$RW_{i1}$" of the resist line width, in the case where the image of the mask pattern 66a having the actual value "$MW_1$" of the mask line width in the first coordinate "$P_1$" is projected onto the first resist layer. Specifically, the collection module 121 calculates a first approximation function of two variables of the dose and the resist line width as the first relationship, based on the first to "i"-th test values and the first to "i"-th actual values "$RW_{11}$"-"$RW_{i1}$". The collection module 121 uses the least squares method, for example.

Also, the collection module 121 collects a second relationship between the first to "i"-th test values of the dose and the first to "i"-th actual values "$RW_{12}$", "$RW_{22}$", "$RW_{32}$", "$RW_{42}$", "$RW_{52}$", -, "$RW_{i2}$" of the resist line width, in the case where the image of the mask pattern 66a having the actual value "$MW_2$" of the mask line width at the second coordinate "$P_2$" is projected onto the first resist layer. Specifically, the collection module 121 calculates a second approximation function of two variables of the dose and the resist line width as the second relationship, based on the first to "i"-th test values and the first to "i"-th actual values "$RW_{12}$"-"$RW_{i2}$", by using the least squares method.

Further, the collection module 121 collects a third relationship between the first to "i"-th test values of the dose and the first to "i"-th actual values "$RW_{13}$", "$RW_{23}$", "$RW_{33}$", "$RW_{43}$", "$RW_{53}$", -, "$RW_{i3}$" of the resist line width, in the case where the image of the mask pattern 66a having the actual value "$MW_3$" of the mask line width at the third coordinate "$P_3$" is projected onto the first resist layer. Specifically, the collection module 121 calculates a third approximation function of two variables of the dose and the resist line width as the third relationship, based on the first to "i"-th test values and the first to "i"-th actual values "$RW_{13}$"-"$RW_{i3}$", by using the least squares method.

Similarly, the collection module 121 collects an "n"-th relationship between the first to "i"-th test values of the dose and the first to "i"-th actual values "$RW_{1n}$", "$RW_{2n}$", "$RW_{3n}$", "$RW_{4n}$", "$RW_{5n}$", -, "$RW_{in}$" of the resist line width, in the case where the image of the mask pattern 66a having the actual value "$MW_n$" of the mask line width at the "n"-th coordinate "$P_n$" is projected onto the first resist layer. Specifically, the collection module 121 calculates an "n"-th approximation function of two variables of the dose and the resist line width as the "n"-th relationship, based on the first to "i"-th test values and the first to "i"-th actual values "$RW_{1n}$"-"$RW_{in}$", by using the least squares method.

The CPU 300 further includes a dose calculator 122 and a control function calculator 123. The dose calculator 122 calculates a first calculated value "$V_1$" of the dose to form the test resist pattern having the resist line width of the designed value "$RW_D$" by the mask pattern 66a having the mask line width of the actual value "$MW_1$" at the first coordinate "$P_1$", based on the first relationship. For example, the dose calculator 122 calculates the first calculated value "$V_1$" of the dose by assigning the design value "$RW_D$" to the variable of the resist line width in the first approximation function.

Also, the dose calculator 122 calculates a second calculated value "$V_2$" of the dose to form the test resist pattern having the resist line width of the designed value "$RW_D$" by the mask pattern 66a having the mask line width of the actual value "$MW_2$" at the second coordinate "$P_2$", based on the second relationship. For example, the dose calculator 122 calculates the second calculated value "$V_2$" of the dose by assigning the design value "$RW_D$" to the variable of the resist line width in the second approximation function.

Further, the dose calculator 122 calculates a third calculated value "$V_3$" of the dose to form the test resist pattern having the resist line width of the designed value "$RW_D$" by the mask pattern 66a having the mask line width of the actual value "$MW_3$" at the third coordinate "$P_3$", based on the third relationship. For example, the dose calculator 122 calculates the third calculated value "$V_3$" of the dose by assigning the design value "$RW_D$" to the variable of the resist line width in the third approximation function.

Similarly, the dose calculator 122 calculates an "n"-th calculated value "$V_n$" of the dose to form the test resist pattern having the resist line width of the designed value "$RW_D$" by the mask pattern 66a having the mask line width of the actual value "$MW_n$" at the "n"-th coordinate "$P_n$", based on the "n"-th relationship. For example, the dose calculator 122 calculates the "n"-th calculated value "$V_n$" of the dose by assigning the design value "$RW_D$" to the variable of the resist line width in the "n"-th approximation function.

Figure 11:
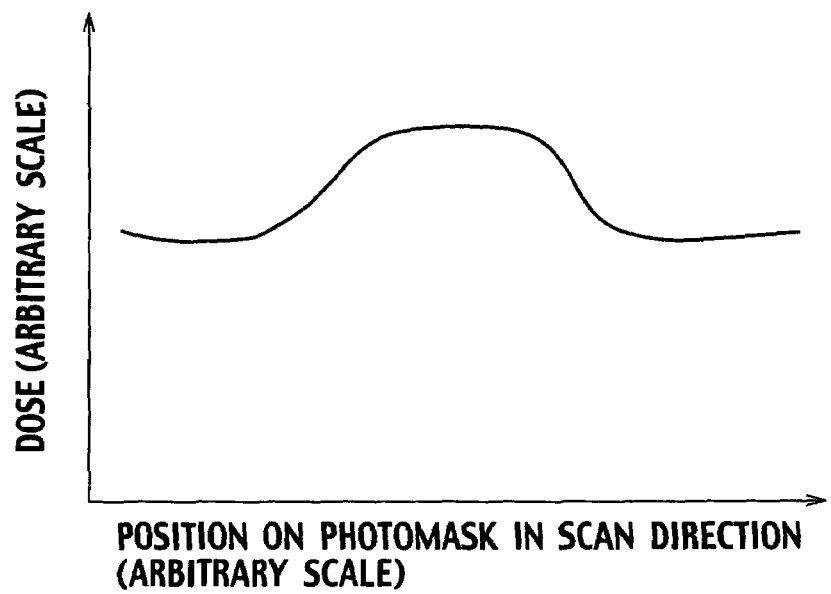
FIG. 11 is a graph showing a control function in accordance with the embodiment of the present invention.

The control function calculator 123 calculates a control function of two variables of the mask position on the photomask and the dose, shown in FIG. 11, based on the relationship between the first to "n"-th coordinates "$P_1$"-"$P_n$" of the mask position on the photomask and the first to "n"-th calculated values "$V_1$"-"$V_n$" of the dose. The control function calculator 123 uses the least squares method, for example. The dose for the constricted portion of the mask pattern 66a where the mask line width is narrow, as shown in FIG. 8, is larger than the dose for the portion of the mask pattern 66a where the mask line width is thick, based on the control function, shown in FIG. 11.

The exposure tool controller 253, shown in FIG. 1, sets an exposure environment of the scanning exposure tool 3, based on the control function, so that the image of the mask pattern of the photomask is scanned and projected onto a second resist layer coated on a second semiconductor substrate disposed on the wafer stage 32 with changing the dose of the light emitted from the light source 41, shown in FIG. 2, depending on the mask position on the photomask.

Figure 12:
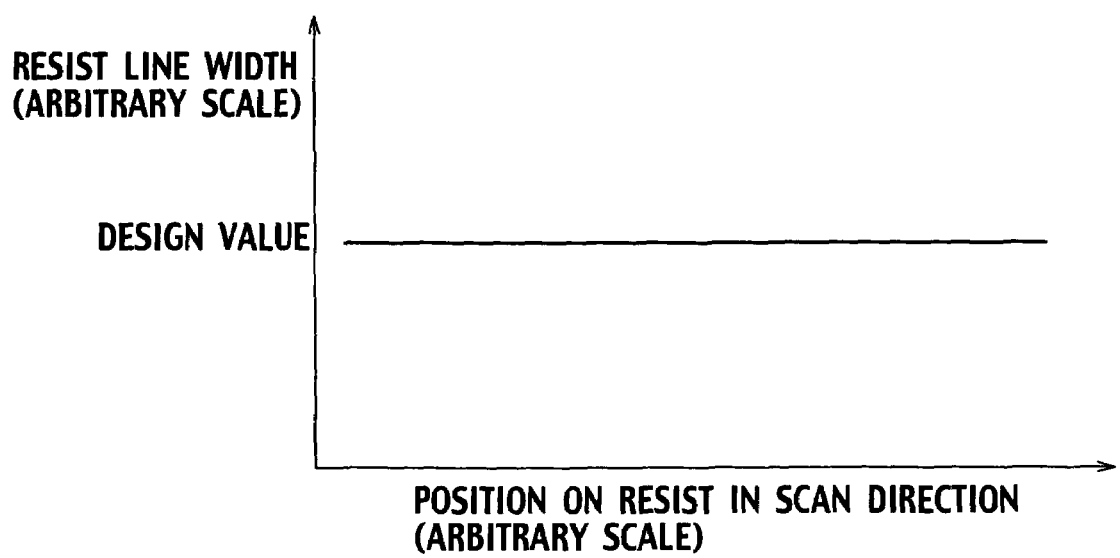
FIG. 12 is a graph showing the resist line width in accordance with the embodiment of the present invention.

For example, the exposure tool controller 253, shown in FIG. 1, sends a control signal to the reticle stage aligner 97, shown in FIG. 2, and the wafer stage aligner 94 of the scanning exposure tool 3 to move the reticle stage 15 and the wafer stage 32. Also, the exposure tool controller 253 monitors the positions of the reticle stage 15 and the wafer stage 32, the scan direction, and the scanning speed, by using the interferometer 99 and the interferometer 95, for example. Further, the exposure tool controller 253 changes the dose of the light emitted from the light source 41, depending on the mask position on the photomask exposed to the light. By changing the dose depending on the mask line width of the mask pattern 66a, a product resist pattern having a constant resist line width, as shown in FIG. 12, is formed on the second semiconductor substrate.

With reference again to FIG. 1, a coater 2, a heater 5, and a developing tool 4 are further connected to the CPU 300. The coater 2 is configured to coat an anti reflection layer and a photoresist such as the first resist layer and the second resist layer on the semiconductor substrate. The spin coater can be used for the coater 2, for example. The heater 5, such as an oven, is configured to bake the first resist layer and the second resist layer on the semiconductor substrates in order to perform a post exposure bake (PEB) process after the first and the second resist layers are exposed to the light in the scanning exposure tool 3. The oven that can control heating conditions including a baking time and an internal temperature can be used for the heater 5. The developing tool 4 is configured to develop the first resist layer and the second resist layer coated on the semiconductor substrates. The developing tool 4 can control developing conditions including concentration of a developer, developer temperature, and developing time.

A data memory 335 is connected to the CPU 300. The data memory 335 includes a product information memory module 340, a process information memory module 339, an approximation function memory module 338, a calculated value memory module 341, and a control function memory module 342. The product information memory module 340 stores a process recipe of the semiconductor device manufactured by using the photomask, shown in FIGS. 3-4. The "process recipe" is data file containing information about the first and second semiconductor substrates, chemicals of the anti reflection layer, the first and second resist layers, coating condition for the chemicals, the numerical aperture (NA) of the exposure tool 3, the coherence factor σ, an aperture type for annular or quadrupolar illumination, the heating conditions in the PEB process, the composition of the developer solution used in the developing tool 4, the concentration of the developer solution, and the developing time to be used for manufacturing the semiconductor device.

The process information memory module 339 stores the actual values "$MW_1$"-"$MW_n$" of the mask line width at the first to "n"-th coordinates "$P_1$"-"$P_n$" respectively, and the first to "i"-th actual values "$RW_{i1}$"-"$RW_{in}$" of the resist line width formed with the dose of the first to "i"-th test values, respectively. The approximation function memory module 338 stores the first to "n"-th approximation functions calculated by the collection module 121. The calculated value memory module 341 stores the first to "n"-th calculated values of the dose for the first to "n"-th coordinates "$P_1$"-"$P_n$", respectively, on the photomask calculated by the dose calculator 122. The control function memory module 342 stores the control function calculated by the control function calculator 123.

The CPU 300 further includes a microscope controller 323, a coater controller 252, a heater controller 255, and a developing tool controller 254. The microscope controller 323 sets the scan rate, the resolution, and the magnification of the microscope 332. The coater controller 252 controls fluid channels to supply the antireflection materials or the resist solution to the coater 2 from chemicals feeders in compliance with the process recipe stored in the product information memory module 340. Also, the coater controller 252 sets the rotation acceleration, the rotation speed, and the coating time of the coater 2. The heater controller 255 adjusts the heating conditions in the heater 5 in compliance with the process recipe stored in the product information memory module 340. The developing tool controller 254 adjusts developing conditions of the developing tool 4 in compliance with the process recipe stored in the product information memory module 340.

An input unit 312, an output unit 313, a program memory 330, and a temporary memory 331 are further connected to the CPU 300. A keyboard and/or a mouse may be used for the input unit 312. A printer and/or display devices, such as a liquid crystal display (LCD) and a cathode ray tube (CRT) display, can be used for the output unit 313, for example. The program memory 330 stores an operating program instructing the CPU 300 to transfer data with apparatuses connected to the CPU 300. The temporary memory 331 stores temporary data calculated during operation of the CPU 300. Computer readable mediums, such as semiconductor memories, magnetic memories, optical discs, and magneto optical discs, can be used for the program memory 330 and the temporary memory 331, for example.

Figure 13:
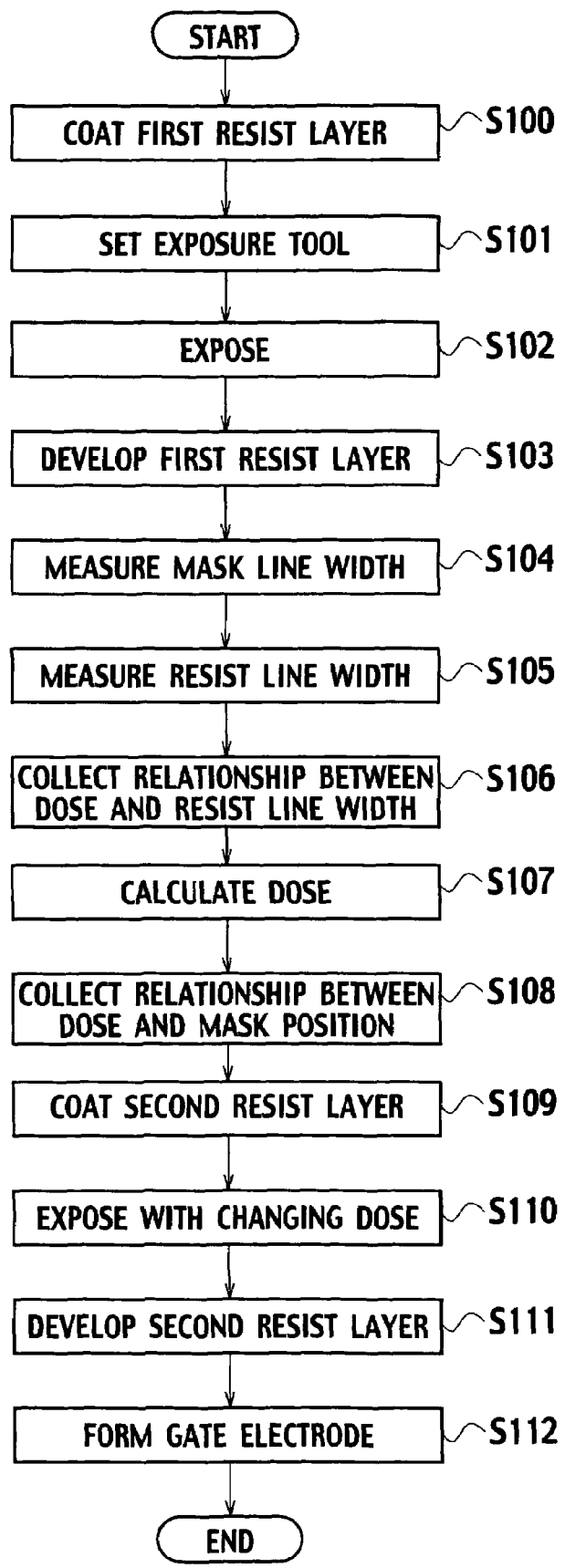
FIG. 13 is a flowchart depicting a method for manufacturing a semiconductor device in accordance with the embodiment of the present invention.

With reference next to FIG. 13, a method for manufacturing the semiconductor device including an exposure method using the exposure system according to the embodiment is described. The calculated results by the CPU 300, shown in FIG. 1, are stored in the temporary memory 331, sequentially.

In step S100, the coater 2 coats the anti reflection layer having a thickness of 60 nm, for example, on the first semiconductor substrate. Then, the coater 2 coats the first resist layer having the design thickness of 300 nm and composed of the chemically amplified negative resist on the anti reflection layer, for example. The cater 2 coats the anti reflection layer and the first resist layer in compliance with the coating conditions, such as the chemicals of the anti reflection layer and the resist, the rotation speed, the temperature, and the amount of the chemicals, stored in the product information memory module 340.

In step S101, the photomask, shown in FIG. 3, is disposed on the reticle stage 15 of the scanning exposure tool 3, shown in FIG. 2. Also, the first semiconductor substrate coated with the first resist layer is disposed on the wafer stage 32. Then, the exposure tool controller 253, shown in FIG. 1, fetches the process recipe from the product information memory module 340. Thereafter, the exposure tool controller 253 sets the exposure environment, such as the numerical aperture (NA), the coherence factor σ, and the aperture type for annular or quadrupolar illumination, in compliance with the process recipe.

In step S102, the scanning exposure tool 3 scans and projects the image of the mask pattern 66a onto a first exposure field of the first resist layer with the dose of the first test value. Next, the scanning exposure tool 3 scans and projects the image of the mask pattern 66a onto a second exposure field of the first resist layer with the dose of the second test value. Continuously, the scanning exposure tool 3 scans and projects the image of the mask pattern 66a onto an "i"-th exposure field of the first resist layer with the dose of the "i"-th test value.

In step S103, the first semiconductor substrate is transported from the scanning exposure tool 3 to the heater 5. Then, the heater 5 bakes the first resist layer in compliance with the process recipe stored in the product information memory module 340. Thereafter, the developing tool 4 develops the first resist layer in compliance with the developing condition defined in the process recipe stored in the product information memory module 340. Consequently, the plurality of test resist patterns are formed. The plurality of test resist patterns correspond to the first to "i"-th test values of the dose, respectively.

In step S104, the microscope 332 defines the first to "n"-th coordinates "$P_1$"-"$P_n$" along the mask pattern 66a on the photomask in the scan direction, as shown in FIG. 6. Then, the microscope 332 measures the actual values "$MW_1$"-"$MW_n$" of the mask line width of the mask pattern 66a at the first to "n"-th coordinates "$P_1$"-"$P_n$", respectively, as shown in FIG. 7. The microscope 332 stores the actual values "$MW_1$"-"$MW_n$" of the mask line width at the first to "n"-th coordinates "$P_1$"-"$P_n$" in the process information memory module 339.

In step S105, the microscope 332 measures the first actual values "$RW_{11}$", "$RW_{12}$", "$RW_{13}$", "$RW_{14}$", "$RW_{15}$", -, "$RW_{1n}$" of the resist line width of the test resist pattern formed with the dose of the first test value, in the scan direction. Then, the microscope 332 measures the second actual values "$RW_{21}$", "$RW_{22}$", "$RW_{23}$", "$RW_{24}$", "$RW_{25}$", -, "$RW_{2n}$" of the resist line width of the test resist pattern formed with the dose of the second test value, in the scan direction. Continuously, the microscope 332 measures the "i"-th actual values "$RW_{i1}$", "$RW_{i2}$", "$RW_{i3}$", "$RW_{i4}$", "$RW_{i5}$", -, "$RW_{in}$" of the resist line width of the test resist pattern formed with the dose of the "i"-th test value, in the scan direction. The microscope 332 stores the first to "i"-the actual values "$RW_{i1}$"-"$RW_{in}$" of the resist line width at the first to "i"-th test values of the dose in the process information memory module 339.

In step S106, the collection module 121 fetches the first to "i"-th actual values "$RW_{11}$"-"$RW_{i1}$" of the resist line width in the case where the image of the mask pattern 66a having the line width of the actual value "$MW_1$" at the first coordinate "$P_1$" is projected onto the first resist layer with the dose of each of the first to "i"-th test values from the process information memory module 339. Next, the collection module 121 calculates the first approximation function of the variables of the dose and the resist line width, based on the first to "i"-th test values of the dose and the first to "i"-th actual values "$RW_{11}$"-"$RW_{i1}$" of the resist line width, by using the least squares method, for example. Also, the collection module 121 calculates the second approximation function, based on the first to "i"-th actual values "$RW_{12}$"-"$RW_{i2}$" of the resist line width in the case where the image of the mask pattern having the line width of actual value "$MW_2$" at the second coordinate "$P_2$" is projected onto the first resist layer with the dose of each of the first to "i"-th test values. Continuously, the collection module 121 calculates the "n"-th approximation function, based on the first to "i"-th actual values "$RW_{n2}$"-"$RW_{n2}$" of resist line width in the case where the image of the mask pattern having the line width of actual value "$MW_n$" at the "n"-th coordinate "$P_n$" is projected onto the second resist layer with the doses of the first to "i"-th test values. The collection module 121 stores the calculated "n"-th approximation function in the approximation function memory module 338.

In step S107, the dose calculator 122 fetches the first approximation function from the approximation function memory module 338. Also, the dose calculator 122 fetches the design value "$RW_D$" of the resist line width of the test resist pattern designed as rectangular from the product information memory module 340. Next, the dose calculator 122 assigns the design value "$RW_D$" to the variable of the resist line width in the first approximation function to calculate the first calculated value "$V_1$" of the dose for forming the test resist pattern having the resist line width of the design value "$RW_D$" by the mask pattern 66a having the mask line width of the actual value "$MW_1$". Also, the dose calculator 122 assigns the design value "$RW_D$" to the variable of the resist line width in the second approximation function to calculate the second calculated value "$V_2$" of the dose for forming the test resist pattern having the resist line width of the design value "$RW_D$" by the mask pattern 66a having the mask line width of the actual value "$MW_2$". Continuously, the dose calculator 122 assigns the design value "$RW_D$" to the variable of the resist line width in the "n"-th approximation function to calculate the "n"-th calculated value "$V_n$" of the dose for forming the test resist pattern having the resist line width of the design value "$RW_D$" by the mask pattern 66a having the mask line width of the actual value "$MW_n$" at the "n"-th coordinate. The dose calculator 122 stores the "n"-th calculated value "$V_n$" of the dose for the "n"-th coordinate in the calculated value memory module 341.

In step S108, the control function calculator 123 fetches the first to "n"-th coordinates "$P_1$"-"$P_n$" of the mask positions on the photomask and the first to "n"-th calculated values "$V_1$"-"$V_n$" of the dose from the calculated value memory module 341. Next, the control function calculator 123 calculates the control function, shown in FIG. 11, of the variables of the mask position on the photomask and the dose, based on the first to "n"-th coordinates "$P_1$"-"$P_n$" of the mask position and the first to "n"-th calculated values "$V_1$"-"$V_n$" of the dose, by using the least squares method, for example. The control function calculator 123 stores the control function in the control function memory module 342.

In step S109, the second semiconductor substrate is prepared. A gate oxide layer and a polycrystalline silicon layer are formed on the surface of the second semiconductor substrate. Next, the coater 2 coats the anti reflection layer on the second semiconductor substrate. Then, the coater 2 coats the second resist layer having the design thickness of 300 nm and composed of the chemically amplified negative resist on the anti reflection layer. The coater 2 coats the anti reflection layer and the second resist layer in compliance with the coating conditions such as the chemicals of the anti reflection layer and the second resist layer, the rotation speed, the temperature, and the amount of the chemicals, stored in the product information memory module 340.

In step S110, the second semiconductor substrate coated with the second resist layer is disposed on the wafer stage 32. Next, the exposure tool controller 253, shown in FIG. 1, fetches the control function from the control function memory module 342. Thereafter, the exposure tool controller 253 sets the exposure environment of the scanning exposure tool 3 so that the scanning exposure tool 3 scans and projects the image of the mask pattern 66a onto the second resist layer with changing the dose of the light emitted from the light source 41, shown in FIG. 2, depending on the mask position on the photomask, as defined by the control function. Then, the scanning exposure tool 3 scans and projects the image of the mask pattern 66a onto the second resist layer with changing the dose depending on the mask line width. Changing the scanning speed, or changing the opening of the slit disposed in the slit holder 54 to change the dose are alternatives. By changing the opening of the slit, a sectional area of the light irradiating the photomask is changed.

In step S111, the second semiconductor substrate is transported from the scanning exposure tool 3 to the heater 5. The heater 5 bakes the second resist layer in compliance with the baking conditions contained in the process recipe stored in the product information memory module 340. Thereafter, the developing tool 4 develops the second resist layer in compliance with the developing conditions defined by the process recipe stored in the product information memory module 340 to form the product resist pattern.

In step S112, the polycrystalline silicon layer exposed from the opening of the product resist pattern is selectively removed by the anisotropic etch process to form a gate electrode on the second semiconductor substrate. Thereafter, the second semiconductor substrate is doped with impurity ions and annealed to form the source region and the drain region. Continuously, the plurality of wiring layers are formed on the second semiconductor substrate and the semiconductor device is provided.

As described above, the exposure system, shown in FIG. 1, and the method for manufacturing the semiconductor device, shown in FIG. 13, make it possible to form the product resist pattern having the constant line width by changing the dose depending on the actual value of the mask line width of the scanned mask pattern 66a, even though the mask pattern 66a designed as rectangular is deformed, as shown in FIG. 5. Optical proximity effect (OPE), uneven baking in the PEB process, and a plurality of factors may change the line width of the product resist pattern. However, the deformation of the mask pattern 66a has much affect on the change of the line width of the product resist pattern. For example, when the product resist pattern of which the line width is designed to be 150 nm is formed by the earlier method, the formed product resist pattern has a line width error of +/−19.5 nm. However, when the product resist pattern is formed by using the exposure system and the method for manufacturing the semiconductor device, according to the embodiment, it is possible to reduce the line width error of the formed product resist pattern within +/−15 nm.

Other Embodiments

Although the invention has been described above by reference to the embodiment of the present invention, the present invention is not limited to the embodiment described above. Modifications and variations of the embodiment described above will occur to those skilled in the art, in the light of the above teachings.

For example, the collection module 121, according to the embodiment, calculates the "n"-th approximation function, as the "n"-th relationship, based on the first to "i"-th actual values "$RW_{1n}$"-"$RW_{in}$" of the resist line width in the case where the image of the mask pattern 66a having the mask line width of the actual value "$MW_n$" at the "n"-th coordinate "$P_n$" is projected onto the first resist layer with the first to "i"-th test values of the dose. Alternatively, the collection module 121 generates a worksheet recording the relationship between the first to "i"-th test values of the dose and the first to "i"-th actual values "$RW_{1n}$"-"$RW_{in}$" of the resist line width, as the "n"-th relationship. In this case, the dose calculator 122 abstracts the most appropriate value of the dose to form the test resist pattern having the resist line width of the designed value "$RW_D$" from the worksheet.

Also, in the embodiment, an example that the photomask used for forming the test resist pattern is used for forming the product resist pattern is described. However, there is no need to use the identical photomask to form the test resist pattern and the product resist pattern. Different photomasks used for manufacturing the same product family may be used for forming the product resist pattern.

As described above, the present invention includes many variations of the embodiments. Therefore, the scope of the invention is defined with reference to the following claims.

What is claimed is:

1. An exposure method comprising:
   forming a plurality of test resist patterns by scanning and projecting an image of a mask pattern onto a first resist layer with a plurality of test values of doses;
   defining a plurality of coordinates of mask positions along the mask pattern in a scan direction;
   measuring a plurality of actual values of mask line widths of the mask pattern at the plurality of coordinates, respectively;
   measuring a plurality of actual values of resist line widths at a plurality of projected positions for each of the test resist patterns, the plurality of projected positions corresponding to the plurality of mask positions in the scan direction, respectively;
   collecting a relationship between the actual values of the resist line widths and the test values of the doses at each of the plurality of coordinates of the mask positions;
   calculating a target value of dose to form a designed value of the resist line width by each of the mask line widths at each of the plurality of coordinates of the mask positions, using the relationship; and
   scanning and projecting the image of the mask pattern onto a second resist layer using the target value of the dose at each of the plurality of coordinates of the mask positions, to make the resist line width constant in the scan direction.

2. The exposure method of claim 1, wherein collecting the relationship comprises calculating an approximation function of variables of the dose and the resist line width for each of the plurality of actual values of the mask line width.

3. The exposure method of claim 2, further comprising:
calculating a plurality of calculated values of the dose corresponding to the plurality of actual values of the mask line width by assigning a design value of the resist line width to the variable of the resist line width.

4. The exposure method of claim 3, further comprising:
approximating a relationship between the mask position and the dose, based on the plurality of coordinates of the mask position and the plurality of calculated values of the dose.

5. The exposure method of claim 1, wherein scanning and projecting the image of the mask pattern onto the second resist layer comprises changing a scanning speed of a photomask having the mask pattern.

6. The exposure method of claim 1, wherein scanning and projecting the image of the mask pattern onto the second resist layer comprises changing a sectional area of a light irradiating a photomask having the mask pattern.

7. A method for manufacturing a semiconductor device, comprising:
forming a first resist layer on a first semiconductor substrate;
forming a plurality of test resist patterns on the first semiconductor substrate by scanning and projecting an image of a mask pattern onto the first resist layer with a plurality of test values of doses;
defining a plurality of coordinates of mask positions along the mask pattern in a scan direction;
measuring a plurality of actual values of mask line widths of the mask pattern at the plurality of coordinates, respectively;
measuring a plurality of actual values of resist line widths at a plurality of projected positions for each of the test resist patterns, the plurality of projected positions corresponding to the plurality of mask positions in the scan direction, respectively;
collecting a relationship between the actual values of the resist line widths and the test values of the doses at each of the plurality of coordinates of the mask positions;
calculating a target value of dose to form a designed value of the resist line width by each of the mask line widths at each of the plurality of coordinates of the mask positions, using the relationship;
forming a second resist layer on a second semiconductor substrate;
scanning and projecting the image of the mask pattern onto the second resist layer using the target value of the dose at each of the plurality of coordinates of the mask positions, to make the resist line width constant in the scan direction; and
forming a product resist pattern corresponding to the image of the mask pattern on the second semiconductor substrate.

8. The method for manufacturing the semiconductor device of claim 7, wherein collecting the relationship comprises calculating an approximation function of variables of the dose and the resist line width for each of the plurality of actual values of the mask line width.

9. The method for manufacturing the semiconductor device claim 8, further comprising:
calculating a plurality of calculated values of the dose corresponding to the plurality of actual values of the mask line width by assigning a design value of the resist line width to the variable of the resist line width.

10. The method for manufacturing the semiconductor device of claim 9, further comprising:
approximating a relationship between the mask position and the dose, based on the plurality of coordinates of the mask position and the plurality of calculated values of the dose.

11. The method for manufacturing the semiconductor device of claim 7, wherein scanning and projecting the image of the mask pattern onto the second resist layer comprises changing a scanning speed of a photomask having the mask pattern.

12. The method for manufacturing the semiconductor device of claim 7, wherein scanning and projecting the image of the mask pattern onto the second resist layer comprises changing a sectional area of a light irradiating a photomask having the mask pattern.

* * * * *